(12) United States Patent
Elizondo-Decanini et al.

(10) Patent No.: US 10,804,804 B1
(45) Date of Patent: Oct. 13, 2020

(54) POWER SUPPLY INCLUDING A NONLINEAR TRANSMISSION LINE THAT RECEIVES A SINGLE INPUT PULSE AND OUTPUTS A PLURALITY OF PULSES

(71) Applicant: National Technology & Engineering Solutions of Sandia, LLC, Albuquerque, NM (US)

(72) Inventors: Juan M. Elizondo-Decanini, Albuquerque, NM (US); Kevin Youngman, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 40 days.

(21) Appl. No.: 15/816,733

(22) Filed: Nov. 17, 2017

Related U.S. Application Data

(60) Provisional application No. 62/537,597, filed on Jul. 27, 2017.

(51) Int. Cl.
    *H02M 3/335* (2006.01)
    *H02M 7/06* (2006.01)
    *H03K 3/00* (2006.01)

(52) U.S. Cl.
    CPC .......... *H02M 3/33507* (2013.01); *H02M 7/06* (2013.01); *H03K 3/00* (2013.01)

(58) Field of Classification Search
    CPC ....... H02M 3/33507; H02M 7/06; H03K 3/00
    See application file for complete search history.

(56) References Cited

U.S. PATENT DOCUMENTS

| | | | | |
|---|---|---|---|---|
| 4,957,393 A | * | 9/1990 | Buelt | B09C 1/065 405/128.6 |
| 5,274,271 A | | 12/1993 | McEwan | |
| 6,437,996 B1 | * | 8/2002 | Wobben | H02J 3/36 363/37 |
| 6,694,438 B1 | * | 2/2004 | Porter | H02J 1/08 713/300 |
| 7,733,194 B2 | * | 6/2010 | Lan | H04B 1/7174 333/20 |
| 7,764,141 B2 | | 7/2010 | Noujeim | |
| 8,154,354 B2 | | 4/2012 | Ricketts et al. | |
| 8,440,899 B1 | * | 5/2013 | Bowser | G10H 1/0066 84/609 |
| 8,922,973 B1 | * | 12/2014 | Elizondo-Decanini | F42D 1/05 361/251 |
| 9,661,733 B1 | * | 5/2017 | Elizondo-Decanini | H05H 1/52 |

(Continued)

*Primary Examiner* — Kyle J Moody
*Assistant Examiner* — Lakaisha Jackson
(74) *Attorney, Agent, or Firm* — Medley, Behrens & Lewis, LLC; Samantha Updegraff

(57) ABSTRACT

Technologies pertaining to a power supply that includes a nonlinear transmission line are described herein. In an embodiment, a DC power supply comprises a pulsing circuit that receives a DC input and outputs a first plurality of pulses having a first frequency to a nonlinear transmission line. The nonlinear transmission line receives the first plurality of pulses and outputs a second plurality of pulses having a second frequency that is greater than the first frequency. The second plurality of pulses is then received at an amplifier/rectifier circuit that amplifies the second pulses to increase a voltage amplitude of the pulses, and rectifies the pulses to provide a substantially constant DC output.

20 Claims, 6 Drawing Sheets

(56) References Cited

U.S. PATENT DOCUMENTS

| | | |
|---|---|---|
| 9,685,296 B1 | 6/2017 | Hoff et al. |
| 2007/0273454 A1* | 11/2007 | Pepper ................... H03B 19/05 333/20 |
| 2008/0203825 A1* | 8/2008 | Nakasha .............. H04B 1/7172 307/106 |
| 2018/0102770 A1* | 4/2018 | Prager ................... H03H 11/02 |

* cited by examiner

POWER SUPPLY INCLUDING A NONLINEAR TRANSMISSION LINE THAT RECEIVES A SINGLE INPUT PULSE AND OUTPUTS A PLURALITY OF PULSES

RELATED APPLICATIONS

This application claims priority to U.S. Provisional Patent Application No. 62/537,597, filed on Jul. 27, 2017, and entitled TRANSISTORLESS POWER SUPPLY, the entirety of which is incorporated herein by reference.

STATEMENT OF GOVERNMENTAL INTEREST

This invention was made with Government support under Contract No. DE-NA0003525 awarded by the United States Department of Energy/National Nuclear Security Administration. The U.S. Government has certain rights in the invention.

BACKGROUND

Electrical power supplies are commonly used to convert an electrical signal from one form into another in order to provide a desired electrical output signal that can be used to power various devices. For example, a power supply may receive a 120 V, 60 Hz alternating current (AC) supply input and provide a constant 12 V direct current (DC) supply output. In other examples a power supply may receive a DC input and provide a DC output at a different voltage. In general, a power supply may be configured to receive a DC or AC input signal having any of various frequency, amplitude, and phase parameters (e.g., within ranges for which the power supply has been designed), and the power supply further configured to output a DC or AC signal having different frequency, amplitude, and/or phase parameters.

Conventional switching power supplies for providing DC output signals generally comprise a high-frequency switching transistor and a transformer or boost converter. Where the conventional switching power supply is configured for AC input, the input signal is first rectified and filtered to generate an unregulated DC signal from the AC input signal (where the unregulated DC signal usually has undesirable voltage ripple or a different voltage level than desired for the power supply output). The unregulated DC signal is then provided as input to the switching transistor. In conventional switching power supplies configured for DC input, a DC input signal is provided directly as input to the switching transistor. The switching transistor switches between on and off states to "chop" the DC signal (e.g., the unregulated DC signal or the direct input DC signal) into a high-frequency series of square pulses. The square pulse signal is then fed to a transformer or boost converter circuit that steps the voltage of the square pulse down or up.

Conventional power supply designs have various size, weight, and power drawbacks due to requirements of some of their components. For example, power supply designs incorporating a transformer may be limited in size and weight by the size requirements of the transformer's core. In other examples, high-frequency switching transistors (e.g., switching between states at frequencies greater than 100 kHz), which may be needed in some conventional designs in order to achieve high enough frequencies to allow smaller transformers to be used, consume significant power and are prone to failure.

SUMMARY

The following is a brief summary of subject matter that is described in greater detail herein. This summary is not intended to be limiting as to the scope of the claims.

Described herein are various technologies pertaining to a nonlinear transmission line for a DC power supply, wherein the nonlinear transmission line is configured to receive a pulse as input and, responsive to receiving the pulse, to output a plurality of pulses of shorter duration than the input pulse. In exemplary embodiments, a DC power supply comprises a pulsing circuit that receives a signal from a voltage source and outputs voltage pulses (e.g., DC square pulses) to a nonlinear transmission line. The nonlinear transmission line receives a voltage pulse from the pulsing circuit and outputs a plurality of pulses of shorter duration and/or greater amplitude than the voltage pulse from the pulsing circuit. An amplifier/rectifier circuit receives the plurality of pulses from the nonlinear transmission line. The amplifier/rectifier is configured to output a DC voltage that is greater in amplitude than a peak amplitude of the signal received by the pulsing circuit from the voltage source, responsive to receiving the plurality of pulses from the nonlinear transmission line. By way of example, the amplifier/rectifier may comprise a Cockcroft-Walton multiplier that simultaneously amplifies and rectifies the voltage pulses output by the nonlinear transmission line. In another example, the amplifier/rectifier comprises a step-up transformer and a bridge rectifier, where the transformer receives the pulses from the nonlinear transmission line and increases the amplitude of the pulses, and the rectifier receives the amplified pulses from the transformer and rectifies them.

The nonlinear transmission line includes at least one variable capacitor, wherein the variable capacitor has a capacitance that is a function of voltage on the capacitor. The nonlinear transmission line may further include one or more inductors, e.g., connected between variable capacitors in the nonlinear transmission line. In exemplary embodiments, the variable capacitors and inductors are selected and arranged in the nonlinear transmission line in order to cause the nonlinear transmission line to output a plurality of pulses such that the plurality of pulses has a desired frequency and/or amplitude. An output of the nonlinear transmission line depends on parameters of the input signal to the nonlinear transmission line and design parameters of the nonlinear transmission line itself. Thus, a configuration of the nonlinear transmission line may depend upon an application of the power supply and requirements on the input signal to the power supply determined by that application.

The above summary presents a simplified summary in order to provide a basic understanding of some aspects of the systems and/or methods discussed herein. This summary is not an extensive overview of the systems and/or methods discussed herein. It is not intended to identify key/critical elements or to delineate the scope of such systems and/or methods. Its sole purpose is to present some concepts in a simplified form as a prelude to the more detailed description that is presented later.

DETAILED DESCRIPTION

Figure 1:
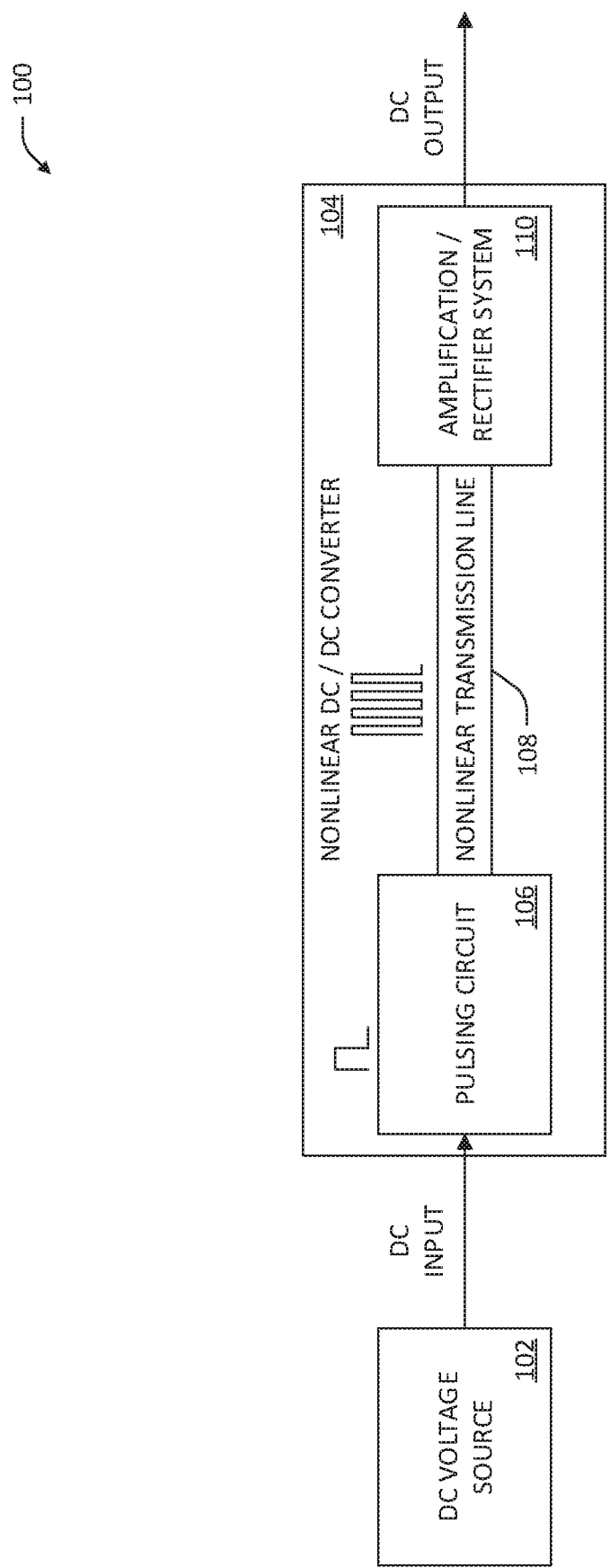
FIG. 1 is a functional block diagram of an exemplary power supply system that comprises a nonlinear transmission line.

Various technologies pertaining to a power supply that comprises a nonlinear transmission line are now described with reference to the drawings, wherein like reference numerals are used to refer to like elements throughout. In the following description, for purposes of explanation, numerous specific details are set forth in order to provide a thorough understanding of one or more aspects. It may be evident, however, that such aspect(s) may be practiced without these specific details. In other instances, well-known structures and devices are shown in block diagram form in order to facilitate describing one or more aspects. Further, it is to be understood that functionality that is described as being carried out by certain system components may be performed by multiple components. Similarly, for instance, a component may be configured to perform functionality that is described as being carried out by multiple components.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form. Additionally, as used herein, the term "exemplary" is intended to mean serving as an illustration or example of something, and is not intended to indicate a preference.

As used herein, the term "directly connected between" is intended to mean that terminals of a particular component are electrically connected to given nodes without any other component included as part of a path between the given nodes along with the particular component. The particular component is directly connected between the given nodes when the particular component is part of a path between the given nodes, where a first terminal of the particular component is electrically connected to a first one of the given nodes, a second terminal of the particular component is electrically connected to a second one of the given nodes, and no intermediary node exists along the path. Thus, when the particular component is directly connected between the given nodes, no other component is in series with the particular component between the given nodes. By way of illustration, a resistor being directly connected between a node A and a node B is intended to mean that a first terminal of the resistor is electrically connected to the node A and a second terminal of the resistor is electrically connected to the node B.

The term "connected between" is intended to encompass both a particular component being directly connected between given nodes and the particular component being part of a path between the given nodes such that one or more other components are also part of the path between the given nodes. When connected between given nodes, the particular component is part of a path between the given nodes that may include one or more intermediary nodes. According to an example, when connected between the given nodes, the particular component can be part of a path between the given nodes that includes a maximum of two intermediary nodes. In accordance with another example, when connected between the given nodes, the particular component can be part of a path between the given nodes that includes a maximum of one intermediary node. Pursuant to an illustration, a resistor being connected between a node A and a node B is intended to include the resistor being directly connected between the node A and the node B as well as configurations such as a first terminal of the resistor being electrically connected to the node A, a second terminal of the resistor being electrically connected to an intermediary node C, a first terminal of a capacitor being electrically connected to the intermediary node C, and a second terminal of the capacitor being electrically connected to the node B.

Moreover, it is to be appreciated that various components described herein may be replaced by an equivalent network of components. For instance, resistors, capacitors, or inductors described herein can be replaced by equivalent resistive, capacitive, or inductive networks.

With reference to FIG. 1, an exemplary DC-to-DC power supply system 100 that incorporates a nonlinear transmission line is illustrated. The system 100 includes a DC voltage source 102 and a nonlinear DC/DC converter 104 that receives a DC input signal from the voltage source 102 and outputs a DC signal that has a greater peak amplitude than the DC input signal. The DC voltage source 102 may be substantially any source of DC power, e.g., a solar panel, battery, other DC power supplies, etc. In various embodiments, the nonlinear DC/DC converter 104 may be implemented as a plurality of components soldered to a common printed circuit board (PCB), or may be implemented as a plurality of components otherwise electrically connected to one another.

The nonlinear DC/DC converter 104 comprises a pulsing circuit 106 connected to a nonlinear transmission line 108, which in turn is connected to an amplifier/rectifier (A/R) system 110. The pulsing circuit 106 receives a DC input signal from the DC voltage source 102. An amplitude of the DC input signal to the pulsing circuit 106 depends upon the DC voltage source 102 used to provide the DC input signal. For example, if the DC voltage source 102 comprises a solar panel, the DC input signal may have an amplitude between 2V and 15V. In another example, if the DC voltage source 102 comprises a high-voltage DC source such as those used in high-energy research applications, the DC input voltage may have an amplitude between 100V and 10 kV.

The pulsing circuit 106 receives the DC input signal from the DC voltage source 102 and outputs a pulse to the nonlinear transmission line 108. In an exemplary embodiment, the pulsing circuit 106 comprises a pulse forming network (PFN) that is configured to receive energy from the DC voltage source 102 (e.g., the DC input signal) and to periodically discharge that energy in a time-limited pulse upon one or more various conditions being satisfied (e.g., a set charging time being reached, a threshold voltage level of charging components being reached, etc.).

In another exemplary embodiment, the pulsing circuit 106 comprises a transistor that is controlled by a control circuit (not shown) to switch between an "on" state in which a channel between a first terminal and a second terminal (e.g., a source and a drain, a collector and an emitter) of the transistor is substantially conducting and an "off" state in which the channel is substantially insulating (e.g., the channel passes less than 10% of the current passed by the channel in the on state for a same applied voltage between the first and second terminals). In embodiments wherein the pulsing circuit 106 comprises a switching transistor, the transistor switches to the on state for a period of time corresponding to a desired pulse duration. By repeatedly switching between the on and off states, the transistor creates a plurality of pulses with a pulse frequency determined by a frequency at which the transistor changes states.

In various embodiments, pulses output to the nonlinear transmission line 108 by the pulsing circuit 106 have a duration ranging from approximately 10 nanoseconds to approximately 100 ms. Depending in part upon a duration of pulses output by the pulsing circuit, the pulses can be output in trains of pulses having frequencies ranging from approximately 10 Hz to approximately 100 kHz.

The nonlinear transmission line 108 comprises a variable capacitor that has a capacitance that varies as a nonlinear function of voltage applied to the variable capacitor. In exemplary embodiments, the variable capacitor may be a varactor diode or a nonlinear ceramic capacitor. In an example, the variable capacitor comprises a p-n junction made of materials comprising Si, GaAs, SiC, or GaN, wherein a voltage-capacitance profile of the p-n junction can be tailored by adjusting the distribution of dopants in the p-n junction. In other examples, the variable capacitor comprises a ferroelectric ceramic capacitor, a type Y5V ceramic capacitor, etc. The nonlinear transmission line 108 is configured such that, responsive to receipt of the pulse from the pulsing circuit 106, the nonlinear transmission line 108 outputs a plurality of pulses that each have a shorter duration than the received pulse. Thus, the nonlinear transmission line 108 outputs pulses having a greater frequency than pulses output by the pulsing circuit 106. For example, the pulsing circuit 106 can be configured to output a first plurality of pulses at a first frequency. For each of the pulses received by the nonlinear transmission line 108, the nonlinear transmission line 108 outputs a plurality of pulses of shorter duration than the received pulse. Hence, in an embodiment, responsive to receiving the first plurality of pulses having the first frequency, the nonlinear transmission line 108 outputs a second plurality of pulses having a second frequency, where the second frequency is greater than the first frequency. By way of example, the second frequency of the second pulses is between 5 and 100 times greater than the first frequency of the first pulses. By way of another example, the second frequency of the second pulses is between 100 kHz and 100 MHz. In another embodiment, responsive to receiving the first plurality of pulses, the nonlinear transmission line 108 outputs the second plurality of pulses, wherein a peak amplitude of the second plurality of pulses is greater than a peak amplitude of the first plurality of pulses (e.g., between 2 and 10 times greater, at least 4 times greater, etc.).

A level of amplification and a change in frequency of pulses from the input to the nonlinear transmission line 108 to the output of the nonlinear transmission line 108 is based upon parameters of the design of the nonlinear transmission line 108 (e.g., line inductance, capacitance profile of variable capacitors in the nonlinear transmission line 108, etc.). Parameters of the nonlinear transmission line 108 can be uniform throughout the length of the nonlinear transmission line 108. In other embodiments, parameters of the nonlinear transmission line vary throughout the length of the nonlinear transmission line 108.

The nonlinear DC/DC converter 104 provides DC to DC amplification without requiring use of a transformer, thereby saving on size and/or weight of the nonlinear DC/DC converter 104 as compared with conventional DC power supplies. In other exemplary embodiments, the nonlinear DC/DC converter 104 does not require high-frequency switching transistors as are commonly used in conventional switching power supplies, which can provide significant reduction in failure probability and/or power consumption due to losses in the transistor.

The A/R system 110 of the nonlinear DC/DC converter 104 may be implemented in a variety of different configurations with the nonlinear transmission line 108. By way of an example, the A/R system 110 comprises a voltage multiplier circuit such as a Cockcroft-Walton multiplier that performs both voltage amplification and rectification. In exemplary embodiments, the DC output of the A/R circuit 110 is in the range of 10 V to 100 V. In other embodiments, the DC output of the A/R circuit 110 is in the range of 100 V to 1 kV. In still further embodiments, the DC output of the A/R circuit 110 is in the range of 1 kV to 500 kV.

Figure 2:
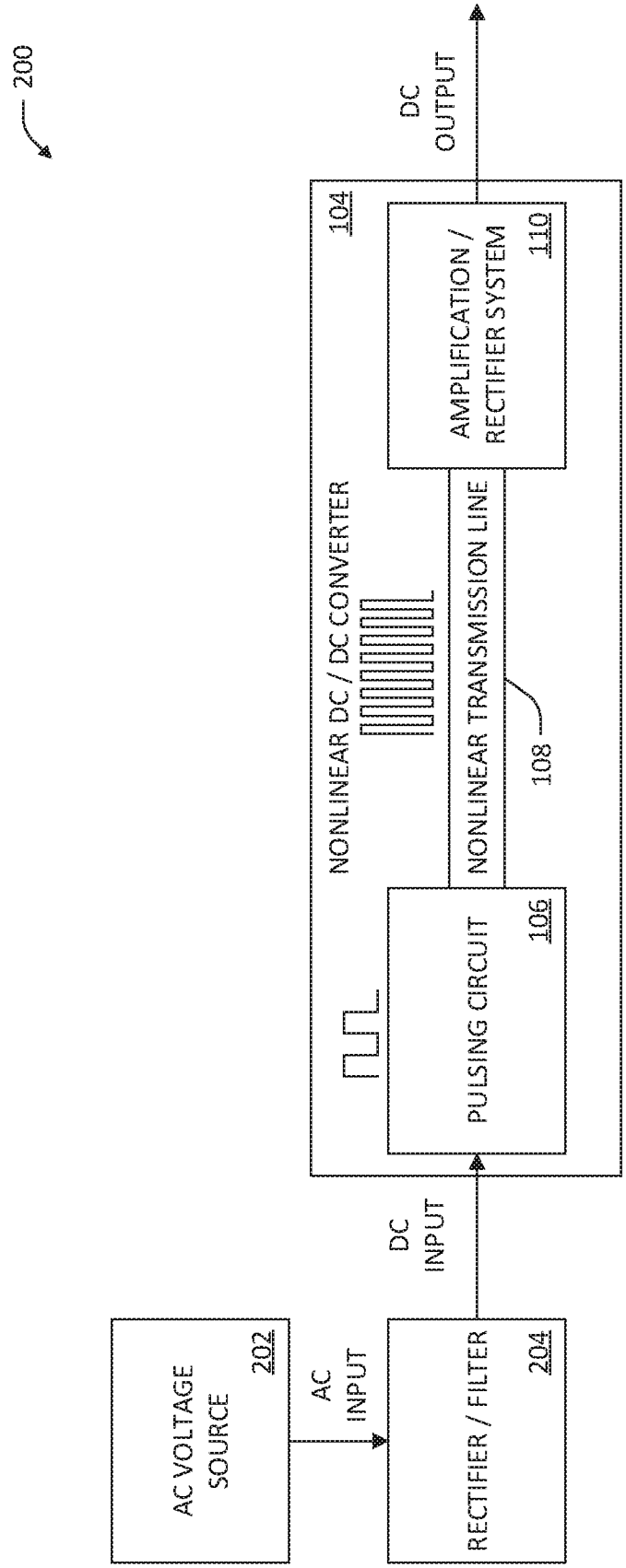
FIG. 2 is a functional block diagram of another exemplary power supply system that comprises a nonlinear transmission line.

In other embodiments, the nonlinear DC/DC converter 104 can be used in a power supply system for converting AC power from an AC source to DC power usable for various DC loads. For example, referring now to FIG. 2, an exemplary AC-to-DC power supply system 200 that includes a nonlinear transmission line is illustrated. The system 200 comprises an AC voltage source 202, such as a line voltage from an ordinary power line (e.g., residential power line), an electric generator, etc.; a rectifier/filter circuit 204; and the nonlinear DC/DC converter 104 described above with respect to FIG. 1. The AC voltage source outputs an AC input signal to the rectifier/filter circuit 204. The rectifier/filter 204 outputs a DC input signal to the nonlinear DC/DC converter 104, which operates as described above.

The AC voltage source 202 outputs an AC voltage that may have various signal parameters, depending upon what elements make up the AC voltage source 202. For example, if the AC voltage source 202 is a line voltage from a residential power line, the AC voltage may be $120/240V_{rms}$ at 60 Hz. The rectifier/filter 204 is a circuit configured to rectify and/or filter the AC input signal from the AC voltage source 202 in order to generate a DC signal that is provided as input to the DC/DC converter 104. In an exemplary embodiment, the rectifier/filter 204 comprises a bridge rectifier circuit coupled to a filter capacitor. The output of the rectifier/filter 204 need not be a constant DC voltage, and the output of the rectifier/filter 204 may exhibit noise, voltage ripple, etc.

Figure 3:
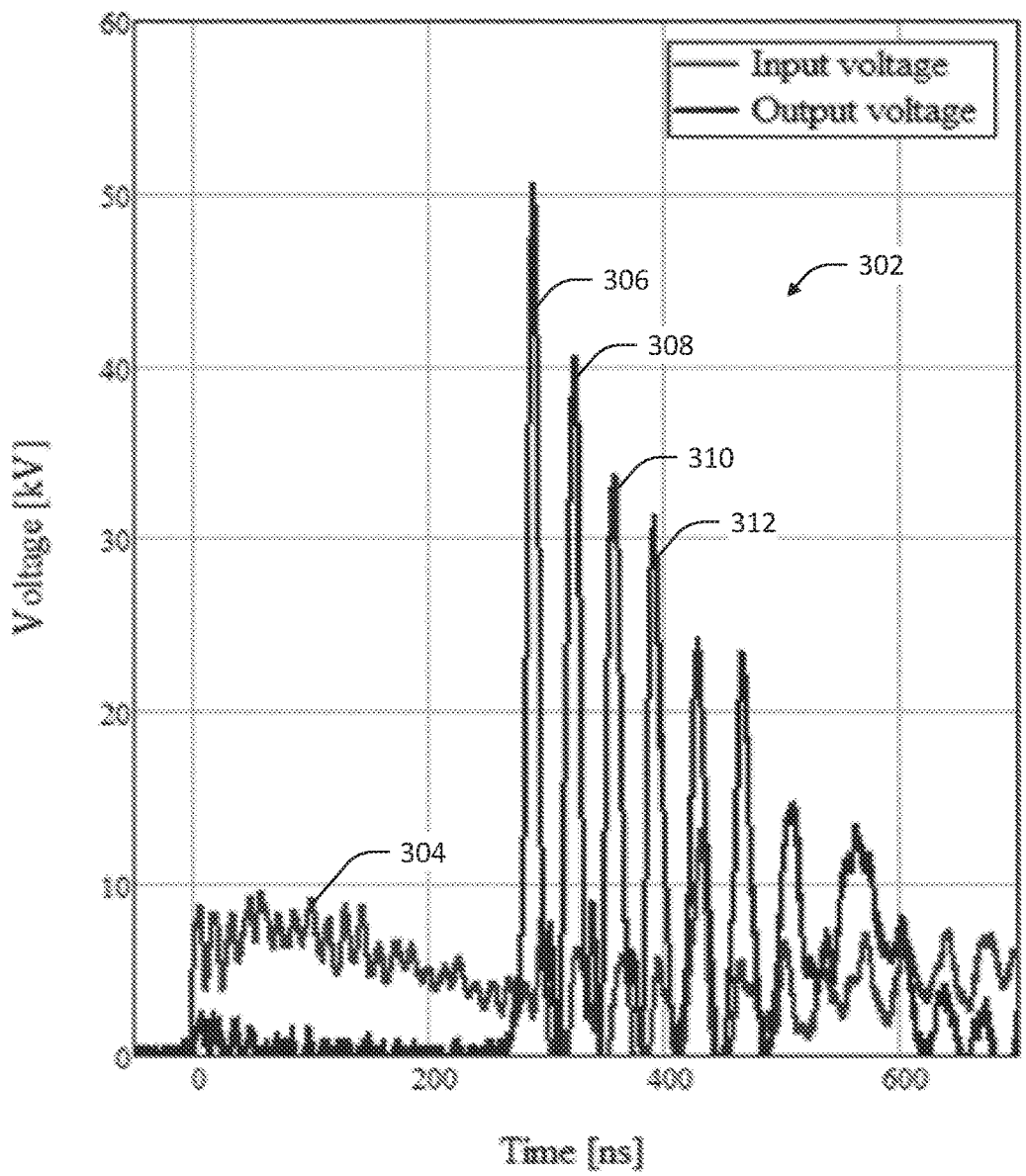
FIG. 3 is a viewgraph of sample results of an input/output response of an exemplary nonlinear transmission line.

Details pertaining to operation of a nonlinear transmission line are now described with respect to FIG. 3, which depicts a viewgraph of certain experimental results pertaining to an exemplary nonlinear transmission line, wherein the nonlinear transmission line comprises one or more variable capacitors. Referring now to FIG. 3, an exemplary viewgraph 300 that illustrates an output response 302 of the exemplary nonlinear transmission line responsive to receiving a pulse input 304 from a voltage source or pulsing circuit is shown. The traces 302, 304 in the viewgraph 300 depict voltage levels of the nonlinear transmission line input 304 and output 302, measured in kV, versus time for a period ranging from 0 nanoseconds to approximately 700 nanoseconds. At 0 nanoseconds, the input 304 pulses to a voltage of approximately 8 kV. The initial input pulse 304 lasts for approximately 300 nanoseconds. Approximately 250 nanoseconds after the input pulse 304 begins, the output 302 of the nonlinear transmission line exhibits a first pulse 306 to a voltage of approximately 50 kV for a period of less than 50 nanoseconds. Shortly thereafter, a second pulse 308, third pulse 310, and fourth pulse 312 are output by the nonlinear transmission line, where the pulses 306-312 are shorter in duration than the duration of the input pulse lasting from 0 nanoseconds to approximately 300 nanoseconds (whereupon the input 304 goes to zero before exhibiting a series of additional, shorter pulses). Furthermore, the pulses 306-312 attain a higher peak voltage than the input pulse. The input pulse of the input signal 304 that lasts from 0 to approximately 300 nanoseconds reaches a peak voltage of nearly 10 kV. The output pulses 306, 308, 310, and 312 peak at approximately 50 kV, 40 kV, 35 kV, and 32 kV, respectively. In general, responsive to receiving an input pulse, a nonlinear transmission line outputs one or more pulses of shorter duration and/or greater amplitude than the input pulse, where the duration, amplitude and number of pulses is constrained by conservation of energy from the input to the nonlinear transmission line to the output of the nonlinear transmission line. From the viewgraph 300 it is apparent that an input pulse may exhibit substantial variation during its period, as the input signal 304 varies significantly over a period of the initial input pulse lasting from 0 to approximately 300 nanoseconds.

Figure 4:
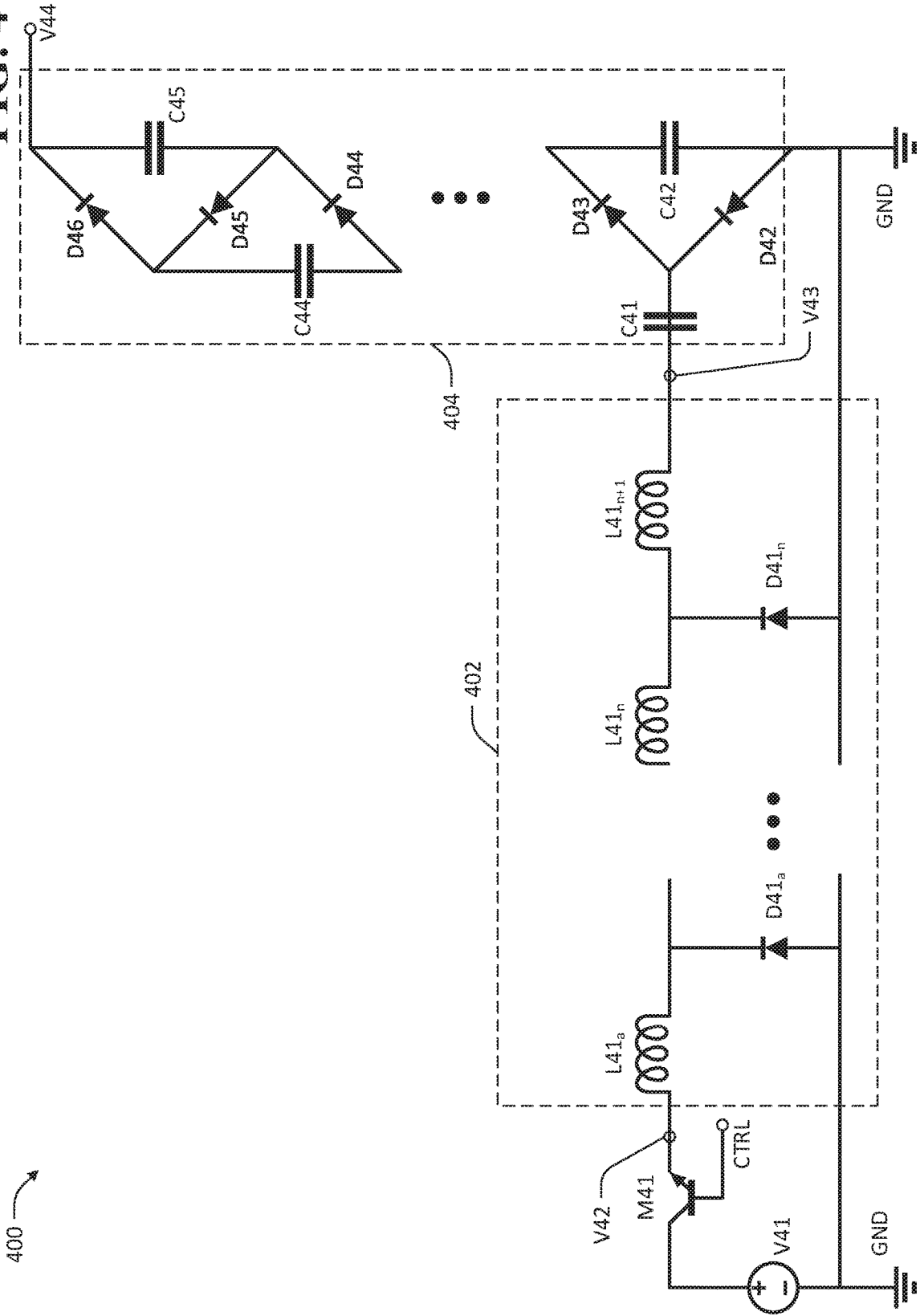
FIG. 4 is a circuit diagram of an exemplary power supply system that comprises a nonlinear transmission line.
Figure 5:
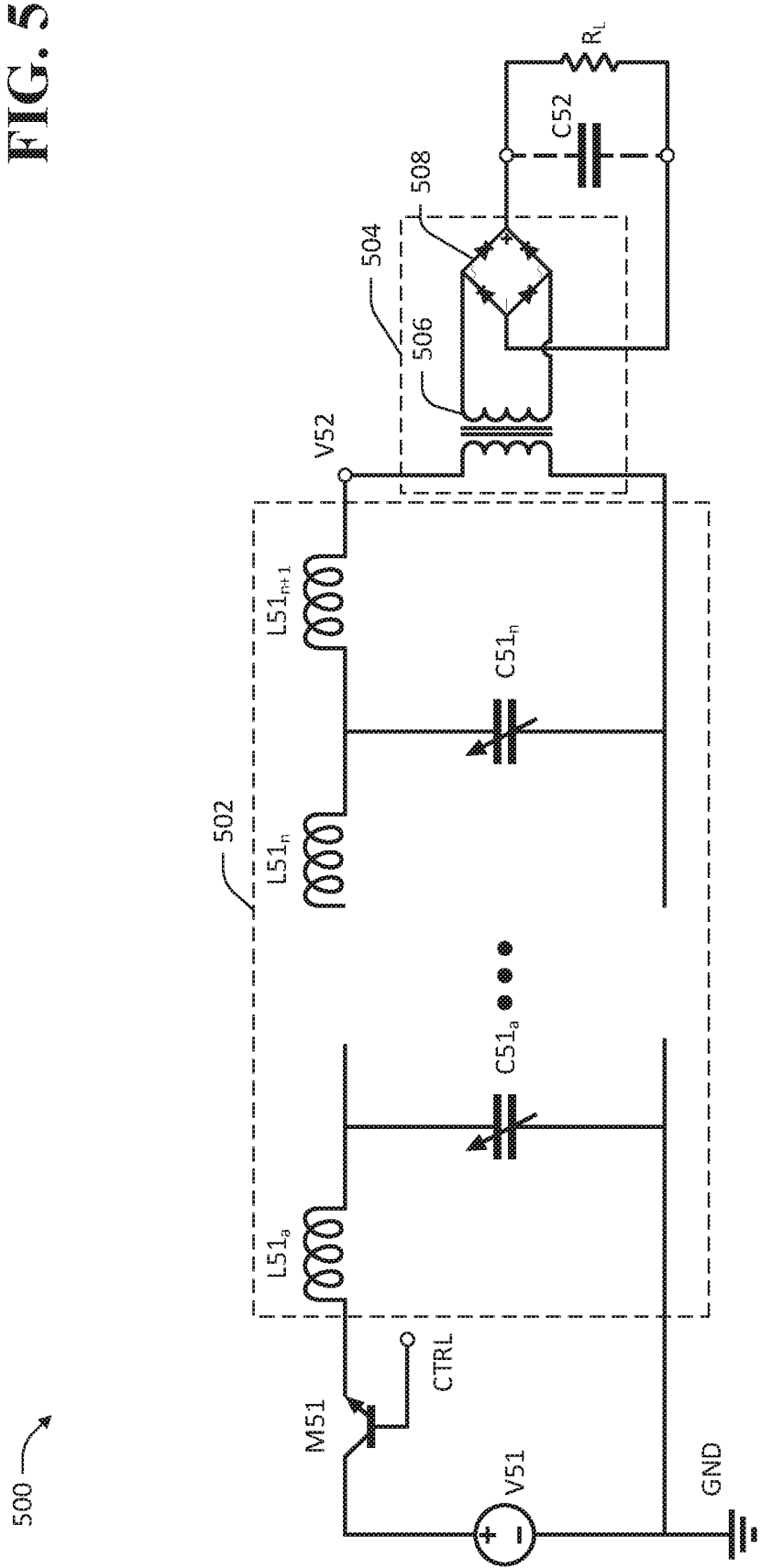
FIG. 5 is a circuit diagram of another exemplary power supply system that comprises a nonlinear transmission line.

Referring now to FIGS. 4 and 5, circuit diagrams for exemplary embodiments of a nonlinear DC/DC converter are illustrated. While the circuit diagrams of FIGS. 4 and 5 show nonlinear DC/DC converters as being supplied by a DC source, it is to be understood that the DC source could be replaced in any of the embodiments shown by a rectifier/filter circuit that outputs a DC signal responsive to receipt of an AC input.

Referring now solely to FIG. 4, a DC power supply 400 that includes a nonlinear transmission line 402 is illustrated. The DC power supply 400 is provided with power by a supply voltage V41. The supply voltage V41 is connected to a transistor M41 that functions as a switching transistor to "chop" the DC signal provided to the transistor M41 by the supply voltage V41. The transistor M41 is controlled by a control input at terminal labeled CTRL (e.g., a gate terminal or base terminal of the transistor M41), provided by a control system (not shown). In an example, the control system may be a clock circuit providing a controlled trigger pulse input to the transistor M41 at a regular frequency. The control input repeatedly switches the transistor M41 between an "on" conducting state and an "off" state in which the transistor M41 is substantially non-conducting. The resulting output of the transistor M41 is a pulsed DC signal. Depending on the control input at CTRL and the source voltage V41, the output of the transistor M41 may take a variety of forms. For example, the output of the transistor M41 may be a square wave that has a constant frequency and pulse width. In other examples, the output of the transistor M41 has a varying frequency and/or pulse width. In still other examples, the output of the transistor M41 may be a non-square pulse (e.g., sawtooth pulse, sinusoidal pulse, etc.).

The transistor M41 is further connected to the nonlinear transmission line 402 at V42, and the transistor M41 outputs the pulsed DC signal to the nonlinear transmission line 402. The nonlinear transmission line 402 receives the pulsed output of the transistor M41, and outputs a plurality of pulses to the voltage multiplier 404. The nonlinear transmission line 402 comprises a plurality of n diodes $D41_a$-$D41_n$, each diode having a capacitance that varies as a function of voltage applied across its terminals. The diodes $D41_a$-$D41_n$ share a common connection to a ground terminal GND by way of their respective anode terminals. The cathode terminals of the diodes $D41_a$-$D41_n$ are connected by a plurality of inductors $L41_a$-$L41_{n+1}$ arranged in a line such that the cathode terminals of the diodes $D41_a$-$D41_n$ are each separated from the cathode terminals of adjacent diodes in the diodes $D41_a$-$D41_n$ by one of the inductors $L41_a$-$L41_n$. The diodes $D41_a$-$D41_n$ are reverse-biased, such that voltages at the cathode terminals of the diodes $D41_a$-$D41_n$ are greater than the common GND voltage at the anode terminals of the diodes $D41_a$-$D41_n$. In various exemplary embodiments, the diodes $D41_a$-$D41_n$ may have a same voltage-capacitance relationship, different voltage-capacitance relationships etc.

Each of the inductors $L41_b$-$L41_n$ is connected to two adjacent inductors in the inductors $L41_a$-$L41_{n+1}$. Terminal inductors $L41_a$ and $L41_{n+1}$ of the transmission line are respectively connected to the transistor M41 and the voltage multiplier 404. In exemplary embodiments, the inductors $L41_a$-$L41_{n+1}$ represent line inductance of conductive elements connecting the diodes $D41_a$-$D41_{n+1}$ along the transmission line 402. In other exemplary embodiments, the inductors $L41_a$-$L41_{n+1}$ are implemented as discrete components. In further embodiments the inductances of the inductors $L41_a$-$L41_{n+1}$ are uniform. In still other embodiments, the inductances of the inductors $L41_a$-$L41_{n+1}$ may vary along the transmission line 402. The nonlinear transmission line 402 outputs a series of pulses that have a greater frequency and/or greater amplitude than pulses received by the nonlinear transmission line 402 from the pulsing transistor M41.

The nonlinear transmission line 402 outputs the series of pulses to the voltage multiplier 404 at V43. The voltage multiplier 404 shown in FIG. 4 comprises a Cockcroft-Walton voltage multiplier, where voltage pulses at V43 successively charge a plurality of capacitors in stages. It is to be understood that other forms of voltage multiplier may be suitable for use in connection with an A/R circuit for various embodiments described herein. The multiplier 404 shown in FIG. 4 comprises m stages, each stage comprising at least two capacitors and at least two diodes. For example, a first stage of the multiplier 404 comprises capacitors C41, C42 and diodes D42, D43, and an mth stage comprises capacitors C44, C45 and diodes D44, D45, D46. A first terminal of the capacitor C41 receives the series of pulses output by the nonlinear transmission line 402 at terminal V43. The pulses successively charge capacitors in the multiplier 404 from the first stage through the mth stage. In some cases, a total charging time of the m stages of the multiplier 404 depends upon a switching speed of the diodes of the multiplier 404. In exemplary embodiments, the diodes of the multiplier 404 are configured to switch between a forward-biased state in which current passes through the diodes and a reverse-biased state in which substantially no current flows (e.g., <10% of a current passed by the diode in a forward-biased state) at a frequency greater than or equal to a frequency of pulses output by the nonlinear transmission line 402. A total voltage developed at output terminal V44 of the multiplier 404 is approximately equal to the number of stages m multiplied by the individual capacitor voltage (e.g., voltage across capacitors C45), where the individual capacitor voltage depends at least in part upon a peak amplitude and/or frequency of the pulses output by the nonlinear transmission line 402. The voltage at output terminal V44 is a substantially constant DC output (e.g., varying within ±10% of a base voltage value).

Referring now solely to FIG. 5, a circuit diagram for another exemplary nonlinear DC/DC converter 500 is shown. The nonlinear DC/DC converter 500 comprises a switching transistor M51 that, in conjunction with a supply input voltage V51, functions as a pulsing circuit, a nonlinear transmission line 502, and an A/R circuit 504. The nonlinear DC/DC converter 500 is supplied by a DC voltage V51 (e.g., as output by a DC source or output by a rectifier responsive to the rectifier receiving an AC signal). The DC voltage V51 is supplied to the transistor M51, and the transistor chops the DC signal into a train of pulses by switching between on and off states responsive to receipt of a control signal CTRL, as described above. The nonlinear transmission line 502 comprises a plurality of variable capacitors $C51_a$-$C51_n$, where each of the variable capacitors $C51_a$-$C51_n$ has a first terminal that is connected to a common ground GND. The second terminals of the variable capacitors $C51_a$-$C51_n$ are separated by inductors $L51_a$-$L51_{n+1}$, as described above with respect to the diodes $D41_a$-$D41_n$ and inductors $L41_a$-$L41_{n+1}$ of the nonlinear transmission line 402 shown in FIG. 4.

The A/R circuit 504 receives the plurality of pulses output by the nonlinear transmission line 502 and outputs a DC voltage to a load $R_L$, the DC output voltage greater than the supply input voltage V51. The A/R circuit 504 comprises a transformer 506 that receives the output of the nonlinear transmission line 502 at node V52, which is connected to a primary winding of the transformer 506. Responsive to receiving the signal from the nonlinear transmission line 502, the transformer 506 outputs a time-varying voltage signal to a bridge rectifier 508 that is connected to a secondary winding of the transformer 506. In exemplary embodiments, the transformer 506 is configured as a step-up transformer (e.g., the transformer 506 has a greater number of turns on the secondary winding than turns on the primary winding). In other embodiments, it may be desirable that the transformer 506 is configured as a step-down transformer. The bridge rectifier 508 rectifies the time-varying voltage signal received from the transformer 506 and outputs the rectified signal to a load, represented by resistor $R_L$ in the circuit diagram of FIG. 5.

A nonlinear DC/DC converter consistent with the disclosure provided herein may additionally comprise filtering elements to further filter and condition output of the nonlinear DC/DC converter to a load. For example, the nonlinear DC/DC converter 500 includes a capacitor C52 that is connected in parallel with the load $R_L$ in order to filter frequencies above a desired cutoff frequency from the rectifier output. It is to be understood that various signal conditioning elements, such as filters, rectifiers, etc. may be incorporated into any of the systems or schematics shown and described herein. For example, filtering elements may be incorporated into the systems 100, 200 in order to eliminate voltage ripple or other undesired voltage variations in the DC output of the nonlinear DC/DC converters 104.

Figure 6:
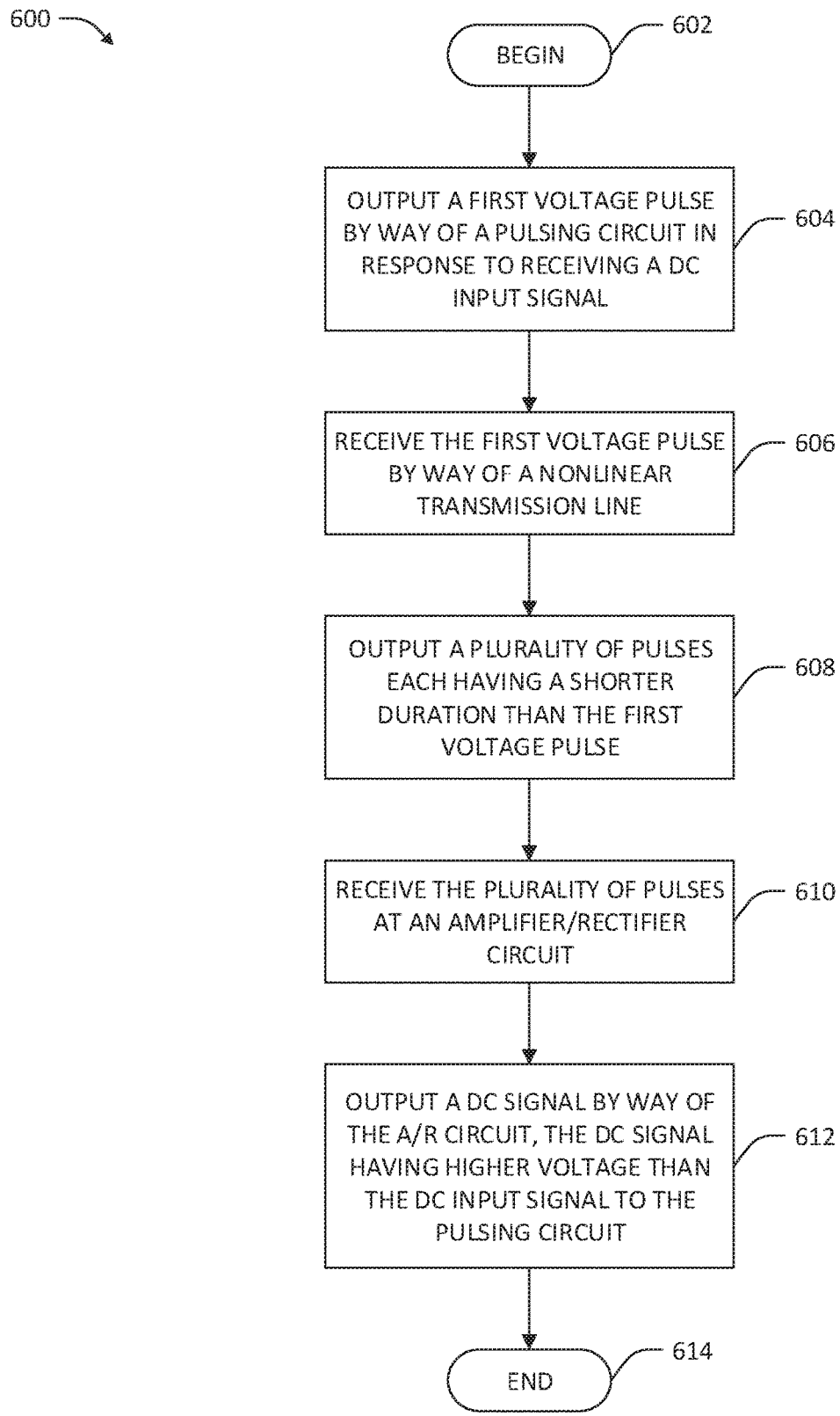
FIG. 6 is a flow diagram that illustrates an exemplary methodology for operating a power supply system that includes a nonlinear transmission line.

FIG. 6 illustrates an exemplary methodology relating to operation of a nonlinear DC/DC converter that comprises a nonlinear transmission line. While the methodology is shown and described as being a series of acts that are performed in a sequence, it is to be understood and appreciated that the methodology is not limited by the order of the sequence. For example, some acts can occur in a different order than what is described herein. In addition, an act can occur concurrently with another act. Further, in some instances, not all acts may be required to implement a methodology described herein.

Referring now to FIG. 6, a methodology 600 for operation of a DC power supply including a nonlinear transmission line is illustrated. The methodology 600 begins at 602, and at 604 a first voltage pulse is output by way of a pulsing circuit in response to the pulsing circuit receiving a DC input signal. In exemplary embodiments the pulsing circuit may be a PFN, switching transistor, etc. At 606, the first voltage pulse is received by way of a nonlinear transmission line that comprises a variable capacitor. At 608, a plurality of pulses are output by way of the nonlinear transmission line in response to receipt of the first voltage pulse. Each of the pulses output by the nonlinear transmission line has a shorter duration than the first voltage pulse. At 610, the plurality of pulses output by the nonlinear transmission line are received at an A/R circuit that is configured to amplify and rectify signals it receives. At 612, a DC signal is output by way of the A/R circuit, where the DC voltage has a higher voltage than the DC input signal to the pulsing circuit. The methodology 600 then ends at 614.

What has been described above includes examples of one or more embodiments. It is, of course, not possible to describe every conceivable modification and alteration of the above devices or methodologies for purposes of describing the aforementioned aspects, but one of ordinary skill in the art can recognize that many further modifications and permutations of various aspects are possible. Accordingly, the described aspects are intended to embrace all such alterations, modifications, and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A system, comprising:
a power supply that is configured to output a substantially constant direct current (DC) output signal, the power supply comprising:
a pulsing circuit that receives a DC input signal and outputs a first pulse;
a nonlinear transmission line (NLTL) that receives the first pulse, wherein receiving the first pulse causes the NLTL to output a plurality of pulses, each of the plurality of pulses having a shorter duration and greater amplitude than the first pulse; and
a rectifier circuit coupled to the NLTL, the rectifier circuit receives the plurality of pulses and outputs the substantially constant DC output signal, the substantially constant DC output signal having a higher voltage than the DC input signal received by the pulsing circuit.

2. The system of claim 1, the pulsing circuit comprises a pulse forming network (PFN).

3. The system of claim 1, the pulsing circuit comprises a chopping transistor configured to switch between an on state and an off state responsive to receipt of a control signal, wherein in the on state the switching transistor conducts the input signal from a first terminal of the switching transistor to a second terminal of the switching transistor, and wherein in the off state the switching transistor does not substantially conduct the input signal from the first terminal to the second terminal.

4. The system of claim 1, wherein the NLTL comprises a varactor diode.

5. The system of claim 1, wherein the NLTL comprises a nonlinear ceramic capacitor.

6. The system of claim 1, wherein the pulsing circuit outputs a first plurality of pulses having a first frequency, the first plurality of pulses including the first pulse, the NLTL receives the first pulses and outputs second pulses having a second frequency, the second pulses including the plurality of pulses output by the NLTL responsive to receipt of the first pulse, where the second frequency is greater than the first frequency.

7. The system of claim 6, the second pulses having a greater peak voltage than the first pulses.

8. The system of claim 1, wherein the rectifier circuit comprises a Cockcroft-Walton multiplier.

9. The system of claim 1, further comprising:
a transformer, wherein the rectifier circuit is coupled to the NLTL by way of the transformer such that the transformer receives the plurality of pulses from the NLTL and amplifies the pulses, and the rectifier circuit receives the amplified pulses.

10. The system of claim 1, the power supply further comprising a second rectifier circuit configured to receive an alternating current (AC) signal from an AC source and output the DC input signal to the pulsing circuit.

11. A method for operating a power supply such that the power supply has a substantially constant direct current (DC) output signal, the method comprising:
outputting, by way of a pulsing circuit, a first pulse in response to receiving a DC input signal at the pulsing circuit;
responsive to receiving the first pulse by way of a nonlinear transmission line (NLTL), outputting a plurality of pulses each having a shorter duration and greater amplitude than the first pulse, wherein receiving the first pulse causes the NLTL to output the plurality of pulses; and
responsive to receiving the plurality of pulses at a rectifier circuit coupled to the NLTL, outputting, by way of the rectifier circuit, the substantially constant DC output signal such that the substantially constant DC output signal has a higher voltage than a voltage of the DC input signal to the pulsing circuit.

12. The method of claim 11, further comprising:
outputting the DC input signal to the pulsing circuit by way of a circuit configured to rectify and/or filter signals responsive to receiving an AC input signal at the circuit configured to rectify and/or filter signals.

13. A power supply having a substantially constant direct current (DC) output voltage, the power supply comprising:
a pulsing circuit that receives an input signal and outputs a first plurality of pulses at a first frequency;
a nonlinear transmission line (NLTL) that receives the first plurality of pulses and outputs a second plurality of pulses at a second frequency, the second frequency greater than the first frequency, a number of the second plurality of pulses being greater than a number of the first plurality of pulses, wherein the second plurality of pulses has a peak amplitude that is greater than a peak amplitude of the first plurality of pulses; and
a rectifier circuit that receives the second plurality of pulses and outputs the substantially constant DC output voltage such that the substantially constant DC output voltage has a greater amplitude than the input signal to the pulsing circuit.

14. The power supply of claim 13, the NLTL configured such that the second plurality of pulses have a peak amplitude at least four times as great as a peak amplitude of the first plurality of pulses.

15. The power supply of claim 13, further comprising a second rectifier circuit that receives an AC signal and outputs the input signal to the pulsing circuit, wherein the input signal comprises a DC signal.

16. The power supply of claim 13, wherein the NLTL comprises a variable capacitor, and wherein the variable capacitor comprises a ferroelectric ceramic capacitor.

17. The power supply of claim 13, wherein the NLTL comprises a variable capacitor, and wherein the variable capacitor comprises a nonlinear ceramic material.

18. The power supply of claim 13, wherein the first frequency ranges between 10 Hz and 100 kHz, and wherein the second frequency ranges between 100 kHz and 100 MHz.

19. The power supply of claim 13, wherein the rectifier circuit comprises a voltage multiplier circuit.

20. The power supply of claim 13, further comprising:
a transformer connected between the NLTL and the rectifier circuit such that the transformer receives the second plurality of pulses from the NLTL and amplifies the second plurality of pulses before the second plurality of pulses are received by the rectifier circuit.

* * * * *